(12) United States Patent
Patra

(10) Patent No.: US 9,161,426 B2
(45) Date of Patent: Oct. 13, 2015

(54) EUV LIGHT SOURCE

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/568,519

(22) Filed: Dec. 12, 2014

(65) Prior Publication Data

US 2015/0137012 A1    May 21, 2015

Related U.S. Application Data

(63) Continuation of application No. PCT/EP2013/064779, filed on Jul. 12, 2013.

(60) Provisional application No. 61/674,451, filed on Jul. 23, 2012.

(30) Foreign Application Priority Data

Jul. 23, 2012 (DE) .......................... 10 2012 212 830

(51) Int. Cl.
*H05G 2/00* (2006.01)
*G03F 7/20* (2006.01)
*H01S 3/09* (2006.01)

(52) U.S. Cl.
CPC ............ *H05G 2/008* (2013.01); *G03F 7/70008* (2013.01); *G03F 7/70025* (2013.01); *G03F 7/70808* (2013.01); *H01S 3/0903* (2013.01); *H05G 2/00* (2013.01)

(58) Field of Classification Search
CPC ......... H05G 2/00; H05G 2/001; H05G 2/003; H05G 2/005; H05G 2/006; H05G 2/008; G21K 5/00; G21K 5/02; G03F 7/20; G03F 7/0808; G03F 7/70025; G03F 9/00
USPC ................................ 250/493.1, 503.1, 504 R
See application file for complete search history.

(56) References Cited

U.S. PATENT DOCUMENTS 4,287,488 A    9/1981    Brau et al.
5,077,774 A  * 12/1991   Piestrup et al. ............... 378/119
(Continued)

FOREIGN PATENT DOCUMENTS

JP      2003/331763 A    11/2003
WO   WO 2009/121438 A1   10/2009

OTHER PUBLICATIONS

German Examination Report, with translation thereof, for corresponding DE Appl No. 10 2012 212 830.1, dated Feb. 22, 2013.
(Continued)

*Primary Examiner* — Nicole Ippolito
*Assistant Examiner* — David E Smith
(74) *Attorney, Agent, or Firm* — Fish & Richardson P.C.

(57) ABSTRACT

An EUV light source for a projection exposure apparatus for EUV projection lithography includes a first electron beam device in the form of an electron beam supply device. The light source furthermore includes an EUV generation device supplied with an electron beam by the electron beam supply device. The light source furthermore includes a second electron beam device in the form of an electron beam disposal device which disposes of an electron beam in the beam path downstream of the EUV generation device. At least one of the electron beam devices on the one hand and the EUV generation device on the other hand are arranged in rooms which are situated one above the other and separated by a building ceiling. At least one electron beam passage is arranged in the building ceiling. This results in an electron beam-based EUV radiation source with the possibility of a manageable operational outlay.

19 Claims, 3 Drawing Sheets

(56) References Cited

U.S. PATENT DOCUMENTS

Figure 1:
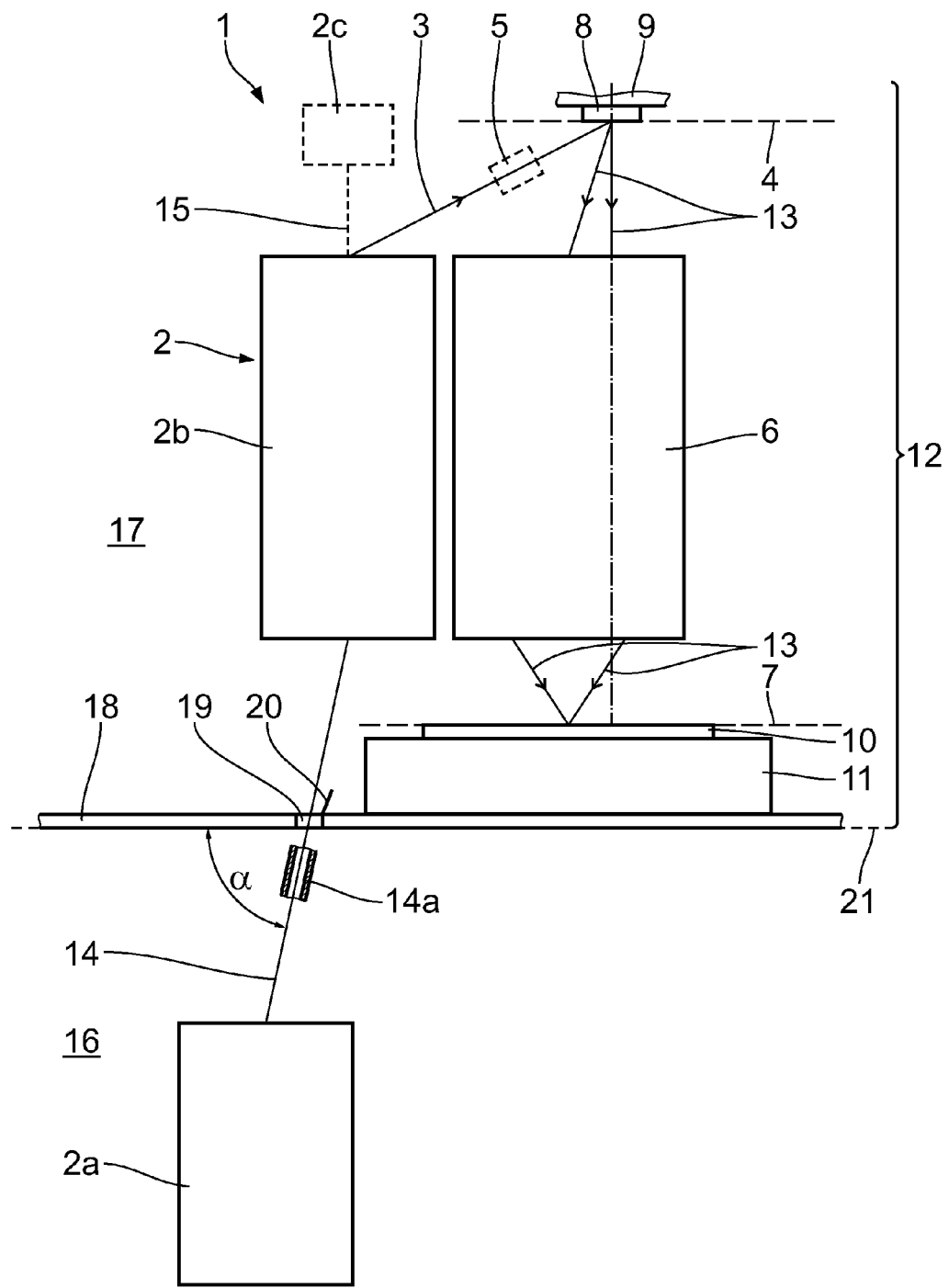

| | | |
|---|---|---|
| 5,825,847 A | 10/1998 | Ruth et al. |
| 5,896,438 A | 4/1999 | Miyake et al. |
| 6,035,015 A | 3/2000 | Ruth et al. |
| 6,410,928 B1* | 6/2002 | Verhoeven et al. ........ 250/492.2 |
| 6,498,351 B1 | 12/2002 | Kruizinga et al. |
| 7,301,972 B2 | 11/2007 | Loewen et al. |
| 2007/0014392 A1 | 1/2007 | Madey et al. |
| 2007/0152171 A1 | 7/2007 | Goldstein et al. |
| 2008/0259303 A1* | 10/2008 | Ossmann et al. ............... 355/66 |
| 2009/0213356 A1* | 8/2009 | Gruner et al. ................... 355/71 |

OTHER PUBLICATIONS

International Search Report for corresponding PCT APpl No. PCT/EP2013/064779, dated Dec. 5, 2013.

* cited by examiner

EUV LIGHT SOURCE

CROSS-REFERENCE TO RELATED APPLICATIONS

The present application is a continuation of, and claims benefit under 35 USC 120 to, international application PCT/EP2013/064779, filed Jul. 12, 2013, which claims benefit under 35 USC 119 of German Application No. 10 2012 212 830.1, filed Jul. 23, 2012. International application PCT/EP2013/064779 also claims priority under 35 USC 119(e) to U.S. Provisional Application No. 61/674,451, filed Jul. 23, 2012. The entire disclosure of international application PCT/EP2013/064779 and German Application No. 10 2012 212 830.1 are incorporated by reference herein.

The invention relates to an EUV light or radiation source for generating EUV radiation.

Such an EUV radiation source is known from U.S. Pat. No. 7,301,972 B2. Further radiation sources are known from US 2009/0213356 A1, U.S. Pat. No. 6,035,015 and U.S. Pat. No. 5,825,847. A projection exposure apparatus with components housed on different building levels has been disclosed in US 2008/0259303 A1.

It is an object of the present invention to develop an electron beam-based EUV radiation source in such a way that this results in the possibility of a manageable operational outlay.

According to the invention, this object is achieved by an EUV light source for a projection exposure apparatus for EUV projection lithography, which includes a first electron beam device in the form of an electron beam supply device, an EUV generation device supplied with an electron beam by the electron beam supply device, and a second electron beam device in the form of an electron beam disposal device, which disposes of an electron beam in the beam path downstream of the EUV generation device. At least one of the electron beam devices on the one hand and the EUV generation device on the other hand are arranged in rooms which are situated one above the other and separated by a building ceiling. At least one electron beam passage is arranged in the building ceiling.

According to the invention, it was identified that it is possible to house main components of the light source on different building levels, i.e. on different floors. This provides the option of housing those components of the light source which are less stringent in terms of cleanroom specifications on a different building floor than other components which either are more stringent in terms of cleanroom specifications or, for other reasons, have to be housed in the same room and/or on the same building level as components which are more stringent in terms of cleanroom specifications. The electron beam supply device and the electron beam disposal device can be arranged on the same building level or on the same floor above or below the EUV generation device. In so doing, only one of the two electron beam devices can be housed on a different building level than the EUV generation device and the other one of the two electron beam devices can be housed on the same building level as the EUV generation device. It is also possible for both electron beam devices to be housed on a different building level than the EUV generation device. The EUV generation device can be an undulator. Use can also be made of an EUV generation device which is based on a preliminary-stage light source with a wavelength which is significantly longer than an EUV wavelength. The EUV light source can be designed like a free electron laser (FEL). A person skilled in the art obtains information in respect of an FEL from e.g. WO 2009/121438 A1. This avoids problems which are connected with conventional EUV radiation sources, for example with an LPP (laser produced plasma) light source or with a GDP (gas discharge produced plasma) light source. The EUV light source can be arranged in such a way that the generated EUV light is available with linear polarization. The arrangement WO 2009/121438 A1 of subsequent beam deflections for the linearly polarized EUV light can then be selected in such a way that this results in a beam deflection with the lowest possible EUV throughput losses. By way of example, the beam deflections can be arranged in such a geometric way that the linearly polarized EUV light, in respect of a plane of incidence, is s-polarized, i.e. perpendicular to the plane of incidence, in the case of a reflecting deflection. The linear polarization can extend parallel to an object displacement direction of the projection exposure apparatus. The linear polarization can alternatively also extend perpendicular to the object displacement direction. To the extent that there is a dipole illumination, a dipole illumination can be polarized with EUV illumination light polarized perpendicular to the dipole axis.

An arrangement can have both electron beam devices arranged on the same building level. Such an arrangement renders it possible to provide in a compact fashion common supply devices for the electron beam devices. The two electron beam devices can be arranged in the same room on the same building level or in different rooms on the same building level.

The electron beam passage can be a vacuum passage. This can render it possible to operate the two rooms separated from one another by the building ceiling with mutually independent cleanroom conditions, without the passage causing interference.

An electron beam guide in the region of the vacuum passage can be such that an electron beam angle of the electron beam with respect to the ceiling plane of the building ceiling through the passage is at least 45°. This renders a compact passage of the electron beam possible.

This applies in particular to an electron beam angle of 90°, i.e. for perpendicular passage of the electron beam through the building ceiling.

Electron beam guides can be S-shaped between the EUV generation device and at least one of the two electron beam devices, or U-shaped between the EUV generation device and at least one of the two electron beam devices. Such electron beam guides were found to be particularly suitable for obtaining a compact design in a vertical and/or horizontal dimension. This results in beam guides which, in the case of electron energies realistic for EUV generation, only lead to low and hence manageable electron beam energy losses.

At least one electron beam device, which is connected to the EUV generation device via the U-shaped electron beam guide, can overlap with the EUV generation device in the vertical direction. Such an overlapping arrangement is particularly compact. This applies in particular when the at least one electron beam device completely overlaps with the EUV generation device in the vertical direction. It is, in particular, possible for both electron beam devices to overlap with the EUV generation device in the vertical direction.

An illumination system for EUV projection lithography can include an EUV light source as described above and an illumination optical unit for illuminating an object field using illumination light generated by the EUV light source, wherein the illumination optical unit is arranged on the same building level as the EUV generation device. The advantages of such an illumination system correspond to those which were already explained above in relation to the EUV light source. If the illumination optical unit is arranged on the same building level as the EUV generation device, this results in small EUV beam paths and in the possibility of providing few deflections. This results in low EUV throughput losses. It is also possible to arrange a whole scanner or stepper, which, in addition to the illumination optical unit, also comprises an object holder for holding in the object field an object to be imaged, a projection optical unit for imaging the object field in an image field and a wafer holder for holding a wafer in the image field, on the same building level as the EUV generation device.

A projection exposure apparatus for EUV projection lithography can include an illumination system described above, an object holder for holding an object in the object field, with a projection optical unit for imaging the object field in an image field, with a wafer holder for holding a wafer in the image field. The advantages of such a projection exposure apparatus correspond to those which were already discussed above with respect to the illumination system according to the invention. It is also possible to arrange the projection optical unit of the projection exposure apparatus on the same building level as the EUV generation device or as the illumination optical unit.

A method for producing a structured component can include providing a reticle and a wafer, projecting a structure on the reticle onto a light-sensitive layer of the wafer with the aid of a projection exposure apparatus described above, and producing a microstructure or nanostructure on the wafer. A structured component can be produced by such a method. The advantages of such a production method and a microstructured or nanostructured component produced according to such a method correspond to those which were already explained above with respect to the projection exposure apparatus.

Figure 2:
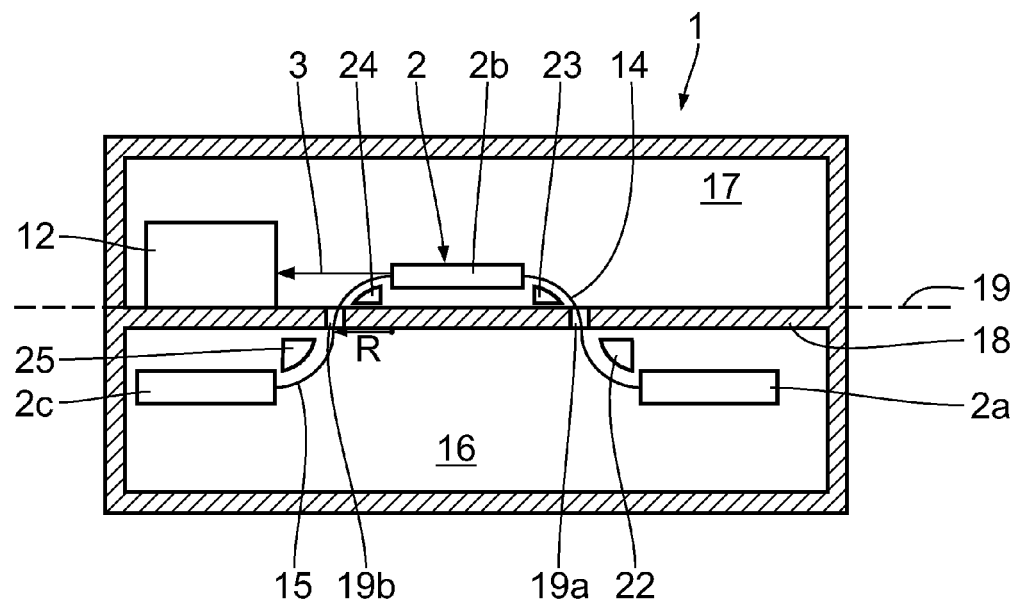
Figure 3:
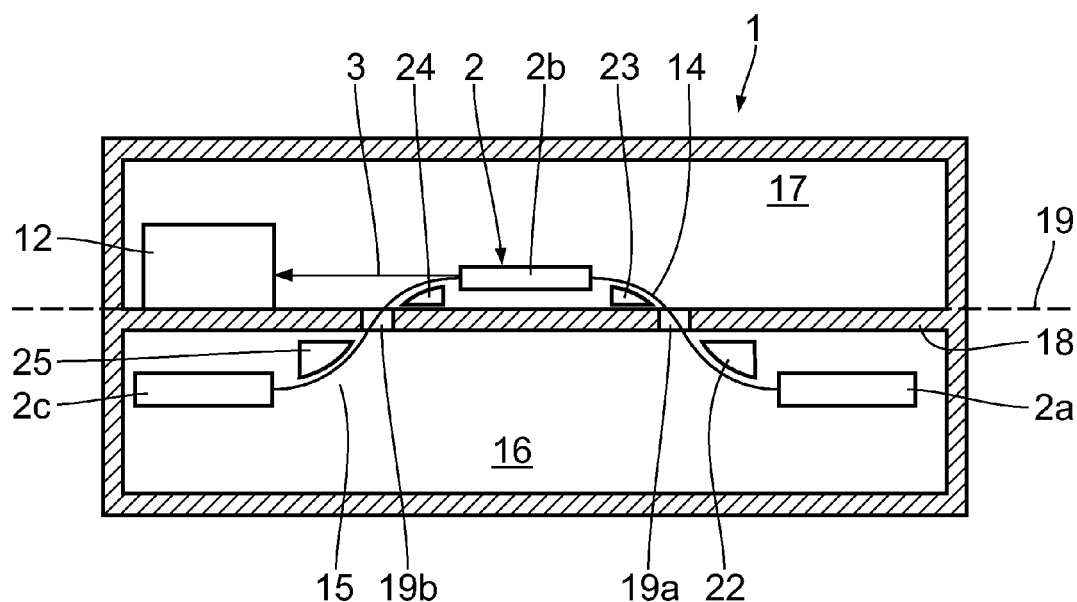
Figure 4:
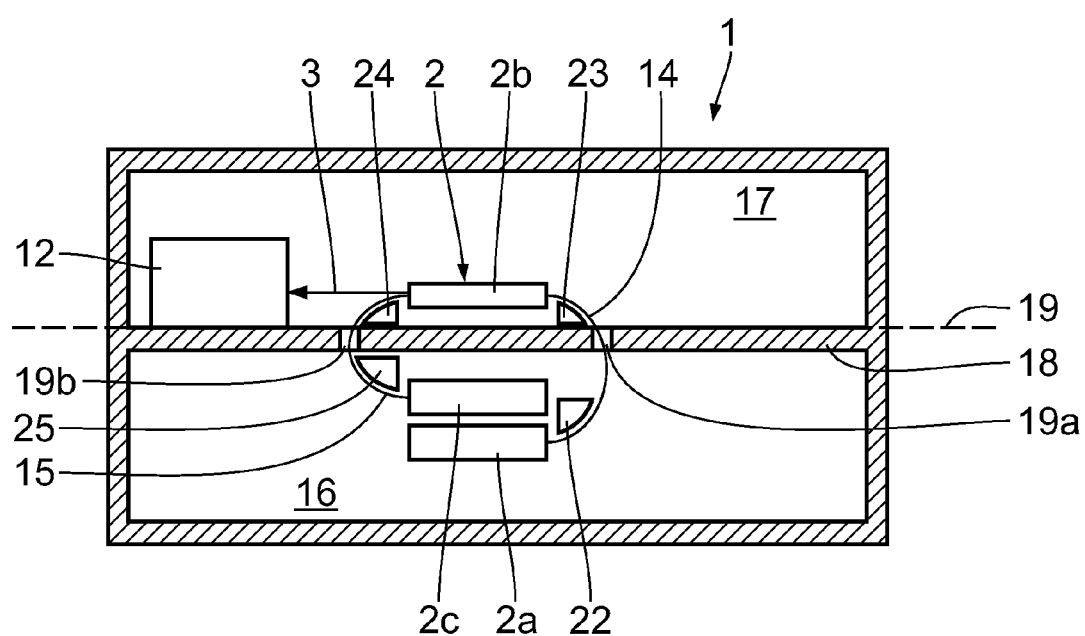

Exemplary embodiments of the invention will be explained in more detail below on the basis of the drawing. In the drawing:

FIG. 1 schematically shows a projection exposure apparatus for projection lithography with a light or radiation source which is housed on two building levels;

FIG. 2 shows, more schematically compared to FIG. 1, a variant of an arrangement of components of the EUV light source on two building levels; and FIGS. 3 and 4 show two further arrangement variants for the components of the EUV light source on two building levels.

FIG. 1 schematically shows main components of a projection exposure apparatus 1, which is used in the production of microstructured or nanostructured components, in particular microstructured or nanostructured integrated circuits. A light or radiation source 2, with main components 2a, 2b and 2c which will be explained in more detail below, generates illumination light or illumination radiation 3 in the form of a radiation beam. The radiation source 2 is an EUV radiation source, which generates radiation in the extreme ultraviolet wavelength region, in particular between 5 nm and 30 nm, for example in the region of 7 nm. As a simplification, FIG. 1 merely illustrates a chief ray of the illumination radiation 3 in sections.

The illumination radiation 3 serves for exposing an object field in an object plane 4 of the projection exposure apparatus 1. Between the radiation source 2 and the object plane 4, the illumination radiation 3 is guided through an illumination optical unit 5. The illumination optical unit 5 is merely indicated by a dashed line in FIG. 1. A projection optical unit 6 serves for imaging the object field in an image field in an image plane 7 of the projection exposure apparatus 1.

Arranged in the object plane 4 there is a reflective reticle 8, the pattern surface of which to be imaged lies in the object field. The reticle 8 is held by a reticle holder 9, illustrated in sections in FIG. 1. Arranged in the image plane 7, there is a wafer 10, the surface of which to be exposed lies in the image field. The wafer 10 is held by a wafer holder 11. In the embodiment according to FIG. 1, the reticle holder 9 is arranged above the wafer holder 11. The projection optical unit 6 is arranged between the reticle holder 9 and the wafer holder 11.

The projection exposure apparatus 1 can be embodied in the style of a stepper or in the style of a scanner. The components of the projection exposure apparatus 1 in the beam path of the illumination light 3 from the reticle holder 9 inclusive are also referred to as scanner or stepper 12 in the following text. The reticle holder 9 and the wafer holder 11 can be displaced, particularly in a manner synchronized with respect to one another, via drives (not illustrated), i.e. via a reticle displacement drive and a wafer displacement drive.

The illumination radiation beam guided by the projection optical unit 6 is indicated at 13 in FIG. 1.

The light source 2 is configured in the style of a free electron laser. The light source 2 has a first electron beam device 2a in the form of an electron beam supply device, an EUV generation device 2b, which is supplied with an electron beam 14 by the electron beam supply device 2a, and a second electron beam device 2c in the form of an electron beam disposal device. Arranged around the electron beam 14, there is an airtight envelope 14a, which is merely illustrated in sections in FIG. 1. The envelope 14a ensures that the electron beam 14 can be guided in the vacuum.

Since several arrangement variants are possible, the electron beam disposal device 2c is indicated by a dashed line in FIG. 1. The electron beam 14 can have a time-averaged current of 1 mA. The electron beam disposal device 2c disposes of an electron beam 15, which is likewise indicated by a dashed line, in the beam path downstream of the EUV generation device 2b.

The electron beam disposal device 2c can simultaneously serve for recuperating energy from the electron beam 15. In the process, a used-current induction of the electrons in the electron beam 15 in an opposing electric field can be employed.

At least one of the electron beam devices 2a and 2c on the one hand and the EUV generation device 2b on the other hand are arranged on different building levels, i.e. in rooms 16, 17 which are situated one above the other and separated by a building ceiling 18. In the arrangement illustrated in FIG. 1, the electron beam supply device 2a is arranged in the room 16 on a lower building floor. The EUV generation device 2b and the electron beam disposal device 2c are arranged on the other side of the building ceiling 18 in the room 17 of the building situated thereabove. As an alternative to the arrangement variant indicated in FIG. 1, it is possible, as will still be explained below, for the electron beam supply device 2a and the electron beam disposal device 2c to be arranged on the same building level or on the same floor above or below the building level or the floor on which the EUV generation device 2b is arranged.

The EUV generation device 2b can be an undulator. Corresponding undulator arrangements as EUV radiation sources are known from U.S. Pat. No. 5,896,438 A and U.S. Pat. No. 6,498,351 B1. The EUV generation device 2b can alternatively have a preliminary-stage light source, which generates a preliminary-stage light beam with a longer wavelength than a wavelength of the EUV radiation, and a superposition device for bringing about a superposition of the electron beam generated by the electron beam supply device and the preliminary-stage light beam in a superposition volume.

An electron beam passage 19 is arranged in the building ceiling 18. The components of the projection exposure apparatus 1 in rooms 16 and 17, in particular the electron beam-guiding and the EUV beam-guiding components, are respectively arranged in an airtight envelope (not illustrated in any more detail in the drawing) such that these components can be operated in a vacuum. The room 17 satisfies more stringent cleanroom specifications than the room 16. The air in the room 17 contains a lower particle density than the air in the room 16. Hence the room 16 satisfies less stringent cleanroom specifications than the room 17. The scanner or stepper 12 is therefore arranged in a cleanroom of higher quality than those electron beam devices which are arranged in the room 16 on the other side of the building ceiling 18. The electron beam passage 19 is configured as a vacuum passage. It has a flap 20 or a slider, via which the electron beam passage 19 can be sealed in a vacuum-tight manner.

In the embodiment according to FIG. 1, the electron beam passage 19 is provided in the building ceiling 18, which carries the scanner or stepper 12 including the EUV generation device 2b.

The electron beam 14 between the electron beam supply device 2a and the EUV generation device 2b assumes an angle α with respect to a ceiling plane 21 of the building ceiling 18 in the region of the passage 19, which angle is approximately 75° in the exemplary embodiment illustrated in FIG. 1. The angle α is also referred to as electron beam angle. Other angles α, which are at least 45° and in particular are greater than 60°, are also possible. Angles α that are greater than 70° are preferred. Angles α, which are greater than 80°, right up to α=90°, i.e. right up to a vertical and perpendicular passage of the electron beam 14 through the building ceiling 18, are particularly advantageous.

FIG. 2 shows an embodiment of the projection exposure apparatus 1, in which the EUV generation device 2b together with the scanner or stepper 12 is arranged in the room 17 on one floor and the two electron beam devices, i.e. the electron beam supply device 2a and the electron beam disposal device 2c, are arranged in the room 16 on a lower floor. Alternatively, it is possible to arrange the electron beam devices 2a, 2c on a floor which lies above the floor on which the scanner or stepper 12 and the EUV generation device 2b are arranged. Components in FIG. 2 which correspond to those which were already explained above with reference to FIG. 1 are denoted by the same reference signs and will not be discussed again in detail.

FIG. 2 schematically illustrates deflection magnets 22, 23, 24, 25, which ensure a deflection of the electron beams 14, 15 on their path between the electron beam supply device 2a and the EUV generation device 2b on the one hand and on their path between the EUV generation device 2b and the electron beam disposal device 2c on the other hand. Here, the first magnet 22 arranged in the electron beam path is arranged in the lower room 16 and ensures a 90° deflection of the electron beam 14, which initially, starting from the electron beam supply device 2a, extends horizontally, up to a vertical course through a first electron beam passage 19a. The angle α in the region of the passage 19a is therefore approximately 90° in the embodiment according to FIG. 2. The magnet 23, which is arranged in the further course of the electron beam 14 toward the EUV generation device 2b and housed in the upper room 17, once again deflects the electron beam 14 by 90° between the initially vertical course through the passage 19a and a horizontal entry into the EUV generation device 2b. In the embodiment according to FIG. 2, the EUV generation device 2b is embodied as an undulator. After the horizontal emergence of the electron beam 15 from the EUV generation device 2b, the further magnet 24, which is likewise housed in the upper room 17, ensures a 90° deflection to a vertical course of the electron beam 15 through a further electron beam passage 19b in the building ceiling 18 between the rooms 16 and 17. The electron beam angle α is also in the region of 90° in the region of the further passage 19b. FIG. 2 also illustrates a radius R of a deflection circular path section of the electron beam 15, which is caused by the magnet 24. All four magnets 22 to 25 generate a correspondingly large deflection radius R. The last magnet 25 in the electron beam path is arranged in the path of the electron beam 15 between the second passage 19b and the electron beam disposal device 2c and deflects the electron beam 15 likewise by 90° between the substantially vertical passage through the second passage 19b and a horizontal entry into the electron beam disposal device 2c.

Thus, the electron beams 14 and 15 respectively follow an S-shaped course between the electron beam supply device 2a and the EUV generation device 2b on the one hand and the EUV generation device 2b and the electron beam disposal device 2c on the other hand.

Typical values for R lie in the range between 0.5 m and 10 m and are, for example, 1 m, 2 m or 5 m. An energy loss of the electron beams 14, 15 caused by the 90° deflections of the magnets 22 to 25 lies in a range between one part in 1000 and 10%, depending on the utilized electron energy. The energy of the electrons in the electron beam 14 lies in the range between 0.2 MeV and 2 MeV.

FIG. 3 shows a variant of a guide of the electron beams 14, 15 in a design of the projection exposure apparatus 1 otherwise corresponding to the design according to FIG. 2. In the embodiment according to FIG. 3, the magnets 22 to 25 are arranged at approximately the same position as in the embodiment according to FIG. 2, but, in contrast to the embodiment according to FIG. 2, they respectively lead to a 45° deflection in the embodiment according to FIG. 3 such that the electron beams 14, 15 are guided through the passages 19a and 19b with an electron beam passage angle of respectively approximately 45° to the building level 19.

FIG. 4 shows a further variant of an arrangement of the components of the EUV light source 2 in an embodiment which otherwise corresponds to that of the arrangements according to FIGS. 2 and 3.

In the projection exposure apparatus 1 according to FIG. 4, the electron beam supply device 2a is arranged in the lower room 16 below the EUV generation device 2b. Here, the arrangement is such that the electron beam supply device 2a overlaps with the EUV generation device 2b in the vertical direction, i.e. as seen in the vertical projection. This overlap can be partial or, like in the case of the arrangement according to FIG. 4, complete.

The magnets 22, arranged in the lower room 16, and 23, arranged in the upper room 17, ensure a 180° deflection of the electron beam 14 between the electron beam supply device 2a and the EUV generation device 2b, i.e. a U-shaped electron beam guide there.

The electron beam disposal device 2c is arranged in the lower room 16 between the EUV generation device 2b, separated therefrom by the building ceiling 18, and the electron beam supply device 2a. The electron beam disposal device 2c is also arranged in such a way that the latter overlaps with the EUV generation device 2b in the vertical direction. This overlap is once again complete in the arrangement according to FIG. 4; however, it can also be partial in an alternative arrangement.

The electron beam 15 between the EUV generation device 2b and the electron beam disposal device 2c is once again deflected by 180° by the magnets 24, arranged in the upper room 17, and 25, arranged in the lower room 16, such that there once again is a U-shaped electron beam guide between the EUV generation device 2b and the electron beam disposal device 2c. A radius of the electron beam 14 guide is greater than a radius of the electron beam 15 guide. In an alternative embodiment (not illustrated), the two electron beam devices 2a, 2c can also interchange their positions, wherein, in that case, a radius of the U-shaped electron beam guide of the electron beam 14 is smaller than a radius of the corresponding guide of the electron beam 15.

The arrangements of the components 2a to 2c of the light source 2, as explained above, can be combined as desired with one another. What is common to all arrangements is that at least one of the two electron beam devices 2a, 2c on the one hand and the EUV generation device 2b on the other hand are arranged in rooms which are situated one above the other and separated by the building ceiling 18. Moreover, it is also common to the embodiments that the EUV generation device 2b is arranged on the same building level as the scanner or stepper 12.

When guiding the electron beams 14, 15, an S-shaped electron beam guide can be combined with a U-shaped electron guide.

In addition to the light source 2, an illumination system of the projection exposure apparatus 1 comprises the illumination optical unit 5 for illuminating the object field on the object plane 4. The illumination optical unit 5 is arranged on the same building level as the EUV generation device 2b.

During the production of a microstructured or nanostructured component using the projection exposure apparatus 1, provision is initially made for the reticle 8 and the wafer 10. A structure on the reticle 8 is subsequently projected onto a light-sensitive layer of the wafer 10 with the aid of the projection exposure apparatus 1. By developing the light-sensitive layer, a microstructure or nanostructure is produced on the wafer 10, and hence the microstructured or nanostructured component is produced, for example a semiconductor component in the form of a storage chip.

The invention claimed is:

1. A light source, comprising:
   a first electron beam device configured to supply an electron beam;
   an EUV generation device configured to receive the electron beam;
   a second electron beam device configured to dispose the electron beam,
   wherein:
      the second electron beam device is downstream of the EUV generation device along a path of the electron beam through the light source during use of the light source;
      the light source is configured so that, during use:
         at least one of the electron beam devices is in a first room of a building;
         the EUV generation device is in a second room separated from the first room by a ceiling of the building; and
         the ceiling of the building has an electron beam passage.

2. The light source of claim 1, wherein the first and second electron beam devices are arranged on the same side of the ceiling of the building.

3. The light source of claim 1, wherein the electron beam passage is a vacuum passage.

4. The light source of claim 3, further comprising an electron beam guide in a region of the vacuum passage.

5. The light source of claim 4, wherein the electron beam guide is configured so that an angle of the beam relative to a plane of the ceiling of the building through the passage is at least 45°.

6. The light source of claim 5, wherein the angle is 90°.

7. The light source of claim 1, further comprising an S-shaped electron beam guide between the EUV generation device and at least one of the first and second electron beam devices.

8. The light source of claim 1, further comprising a U-shaped electron beam guide between the EUV generation device and at least one of the first and second electron beam devices.

9. The light source of claim 8, wherein the at least one electron beam device which is connected to the EUV generation device via the U-shaped electron beam guide overlaps with the EUV generation device in a vertical direction.

10. The light source of claim 1, further comprising a plurality of magnets configured to interact with the electron beam between the first and second electron beam devices.

11. The light source of claim 1, wherein the light source is a free electron laser.

12. The light source of claim 1, wherein, during use of the light source, the electron beam has a time-averaged current of one milliAmp.

13. The light source of claim 1, wherein the EUV generation device comprises an undulator.

14. The light source of claim 1, wherein the light source is configured so that, during use of the light source, the light beam has a section that is circular.

15. The light source of claim 14, wherein the circular section of the electron beam path has a radius of deflection that is between 0.5 meter and 10 meters.

16. An illumination system, comprising:
   a light source according to claim 1;
   an illumination optical unit configured to illuminate an object field using illumination light generated by the light source,
   wherein the illumination optical unit is configured to be on the same building level as the EUV generation device.

17. An apparatus, comprising:
   a light source according to claim 1;
   an illumination optical unit configured to illuminate an object field using illumination light generated by the light source; and
   a projection optical unit configured to image the object field into an image field,
   wherein the apparatus is an EUV microlithography projection exposure apparatus.

18. A method of using an apparatus comprising a light source, an illumination optical unit and a projection optical unit, the method comprising:
   using the illumination system to illuminate a structure on a reticle with light provided by the light source; and
   using the projection optical unit to image at least a portion of the illuminated structure of the reticle onto a light-sensitive material,
   wherein the light source is a light source according to claim 1.

19. A building having a first room, a second room, and a ceiling separating the first and second rooms, the building comprising:
   a light source, comprising:
      a first electron beam device configured to supply an electron beam;
      an EUV generation device configured to receive the electron beam;

a second electron beam device configured to dispose the
electron beam,
wherein:
the second electron beam device is downstream of the EUV generation device along a path of the electron beam through the light source during use of the light source;
at least one of the electron beam devices is in the first room;
the EUV generation device is in the second room; and
the ceiling of the building has an electron beam passage.

* * * * *